(12) United States Patent
Chen et al.

(10) Patent No.: US 9,188,609 B2
(45) Date of Patent: Nov. 17, 2015

(54) CURRENT MONITOR AND ELECTRIC POWER QUALITY COMPENSATION SYSTEM

(76) Inventors: Shaohua Chen, Taoyuan Hsien (TW); Yaping Yang, Taoyuan Hsien (TW); Bin Wang, Taoyuan Hsien (TW)

( * ) Notice: Subject to any disclaimer, the term of this patent is extended or adjusted under 35 U.S.C. 154(b) by 326 days.

(21) Appl. No.: 13/604,191

(22) Filed: Sep. 5, 2012

(65) Prior Publication Data

US 2013/0278243 A1    Oct. 24, 2013

(30) Foreign Application Priority Data

Apr. 20, 2012    (CN) .............................. 201210118826

(51) Int. Cl.
    *G01R 15/18*    (2006.01)
    *G01R 19/00*    (2006.01)
    (Continued)

(52) U.S. Cl.
    CPC .................................. *G01R 19/0092* (2013.01)

(58) Field of Classification Search
    CPC ........... H02M 5/10; H02M 1/32; H02M 7/06; H02M 2001/0009; H04B 5/0037; G01R 19/0092; G01R 15/06; G01R 15/14; G01R 17/00; G01R 31/40; G01R 31/42; G01R 15/181; G01R 19/2513; H02H 7/04; H05B 33/0815; H05B 39/04; H05B 37/02
    USPC ........... 324/76, 117, 105, 127, 323, 632, 670, 324/117 R, 140 R, 415; 323/357, 282, 284, 323/288, 271, 222–224, 301, 209, 229; 363/21.01, 126, 21.17, 17, 21.15
    See application file for complete search history.

(56) References Cited

U.S. PATENT DOCUMENTS 3,781,671 A * 12/1973 Preikschat .................... 324/670
5,539,300 A *  7/1996 Mathieu ......................... 323/249
(Continued)

FOREIGN PATENT DOCUMENTS

| JP | 4-138028 A | 5/1992 |
| TW | 340272 | 9/1998 |
| TW | 201106794 A | 2/2011 |

OTHER PUBLICATIONS

"First Office Action" issued by the Intellectual Property Office, Ministry of Economic Affairs, R.O.C. dated Nov. 6, 2014, Taiwan.
(Continued)

*Primary Examiner* — Tung X Nguyen
*Assistant Examiner* — Neel Shah
(74) *Attorney, Agent, or Firm* — Yunling Ren; Eaton & Van Winkle

(57) ABSTRACT

It's disclosed a current monitor and an electric power quality compensation system. The current monitor includes: an internal monitor module configured to output a measurement of current for characterizing a real-time electric power quality of an external power network based on a received detection current, wherein an external detection module is used to detect a current of the external power network and output a first level detection current; and an isolation and transfer module including an input side and an output side electrically isolated from each other, wherein the input side is configured to be connected with the external detection module, and the output side is configured to be connected with the internal monitor module, the isolation and transfer module receives the first level detection current and outputs a second level detection current to the internal monitor module.

12 Claims, 16 Drawing Sheets

(51) Int. Cl.
   *G01R 31/42* (2006.01)
   *H05B 33/08* (2006.01)

(56) References Cited

U.S. PATENT DOCUMENTS

| | | | |
|---|---|---|---|
| 5,949,231 A * | 9/1999 | Lau | 324/127 |
| 7,577,003 B2 | 8/2009 | Nakamura | |
| 7,751,168 B2 | 7/2010 | Itakura | |
| 2007/0217234 A1 | 9/2007 | Nakamura | |
| 2008/0157751 A1 * | 7/2008 | Jones | 324/127 |
| 2011/0211372 A1 * | 9/2011 | Wei et al. | 363/21.17 |

OTHER PUBLICATIONS

"First Office Action" issued by the State Intellectual Property Office of The People's Republic of China on Feb. 2, 2015.

* cited by examiner

CURRENT MONITOR AND ELECTRIC POWER QUALITY COMPENSATION SYSTEM

CROSS REFERENCE TO RELATED APPLICATIONS

The present application claims priority under 35 U.S.C. §119 to Chinese Patent Application No. 201210118826.9, filed on Apr. 20, 2012, the entire content of which is incorporated herein by reference.

TECHNICAL FIELD

The present application relates to current detection technologies, more particularly to a current monitor and an electric power quality compensation system.

BACKGROUND

With increasing requirements for suppressing reactive powers and harmonics, various electric power quality compensation systems have been widely used. These electric power quality compensation systems perform real-time detection on external power networks through external detection modules and internal current monitor so as to compensate electric power qualities of the external power networks.

FIG. 1 illustratively shows an application example of an electric power quality compensation system in conventional technologies. In FIG. 1, the electric power quality compensation system 600 includes an external detection module 1, a compensation module 40 and a conventional current monitor 30. The external detection module 1 detects a current of an external power network 2 in real time, while the external power network 2 includes a power grid 21 and a non-linear load 22, for example. The non-linear load 22 may be a harmonic source, for example. The compensation module 40 and the non-linear load 22 are connected in parallel with the power grid 21 in order to compensate the harmonics of the non-linear load 22.

The conventional current monitor 30 may include one single internal monitor unit or a plurality of internal monitor units. The compensation module 40 may include one or more compensation units. The conventional current monitor 30 is connected with an output side of the external detection module 1 through an external cable 6. The compensation module 40 may realize a good filtering effect by distributing output(s) of the compensation unit(s) based on the current measured by the internal monitor unit(s) in the conventional current monitor 30.

However, the conventional current monitor has following problems.

The external detection module 1, with output of which being connected with the conventional current monitor 30, has an output load including an equivalent impedance of the external cable 6 provided between the conventional current monitor 30 and the external detection module 1 and an equivalent impedance of the measurement loop in the conventional current monitor 30. If the output load of the external detection module 1 goes beyond the output-load capacity of the external detection module 1, the current will be detected by the external detection module 1 inaccurately, and thereby the compensation effect of the electric power quality compensation system 600 will be deteriorated.

For example, the external detection module 1 may be an external current transformer comprising a primary side as the input of the external detection module 1 and a secondary side as the output of the external detection module 1 respectively. The primary side of the external current transformer is connected in series between the power grid 21 and the non-linear load 22, and the secondary side is connected with the conventional current monitor 30. As shown in FIG. 2, the secondary-side load of the external current transformer consists of two parts: one is the equivalent impedance Z6 of the external cable 6, and the other one is the equivalent impedance of the measurement loop of the conventional current monitor 30. The latter includes the equivalent impedance Z32 of the internal monitor unit(s), and further includes the equivalent impedance Z31 of the internal connection wires among the internal monitor units when there are pluralities of internal monitor units. The equivalent impedance Z6 of the external cable 6 may be expressed by an equation: Z6=resistivity of the external cable 6×length of the external cable 6/sectional area of the external cable 6. The equivalent impedance Z31 of the internal connection wires may be expressed by an equation: Z31=resistivities of the internal wires×lengths of the internal wires/sectional areas of the internal wires. It can be seen that, the more the number of the internal monitor units is, and the longer the internal wires' lengths are when the sectional areas are kept unchanged, the greater the equivalent impedance of the detection loop of the conventional current monitor 30 will be.

In general, an external current transformer has a small secondary-side capacity. For example, a current transformer with a transformation ratio of 500/5 or less usually has a secondary-side capacity of 5 VA (volt·ampere) or less, and a current transformer with a transformation ratio of 1000/5 or less usually has a secondary-side capacity of 10 VA or less. If an external current transformer has a large load which is likely to go beyond the secondary-side capacity, the current will be detected by the external current transformer inaccurately, and thereby the subsequent compensation effects of the compensation modules will be deteriorated.

To avoid the above-mentioned problem of the over large output load of the external detection module deteriorating the accuracy, conventional solutions include adjusting the distance between the current monitor and the external detection module to reduce the output-side load of the external detection module, or limiting the equivalent impedance of the measurement loop of the current monitor in the capacity of the external detection module. However, one of the above two solutions will restrict the geographical location of the current monitor, and the other will limit the selective scope of the current monitor. Thus, both of the two solutions are not ideal.

SUMMARY OF THE INVENTION

One object of the present application is to provide a current monitor and an electric power quality compensation system so as to avoid the output side of the external detection module from being overloaded, or to get away from applying restrictions to the geographical location or the selective scope of the current monitor.

The present application provides a current monitor comprising:

an internal monitor module configured to output a measurement of current for characterizing a real-time electric power quality of an external power network based on a received detection current, wherein an external detection module is used to detect a current of the external power network and output a first level detection current; and an isolation and transfer module including an input side and an output side electrically isolated from each other, wherein the input side is configured to be connected with the external detection module, the output side is configured to be connected with the internal monitor module, and the isolation and transfer module receives the first level detection current and outputs a second level detection current to the internal monitor module so as to reduce the impedance of the internal monitor module reflected to the external detection module.

The present application further provides an electric power quality compensation system. The electric power quality compensation system comprises:

an external detection module configured to detect a real-time current of an external power network and output a first level detection current;

a current monitor which includes:

an internal monitor module configured to output a measurement of current for characterizing a real-time electric power quality of the external power network based on a received detection current; and an isolation and transfer module including an input side and an output side electrically isolated from each other, wherein the input side is configured to be connected with the external detection module, the output side is configured to be connected with the internal monitor module, and the isolation and transfer module receives the first level detection current and outputs a second level detection current to the internal monitor module so as to reduce the impedance of the internal monitor module reflected to the external detection module;

and a compensation module connected with the internal monitor module in the current monitor and configured to compensate the electric power quality of the external power network based on the measurement of current output from the internal monitor module.

In the embodiments of the present application, the isolation and transfer module is added into the current monitor and outputs a second level detection current to the internal monitor module based on a first level detection current received from the external detection module 1, and thus plays a role of reducing the equivalent impedance of the internal monitor module reflected to the external detection module. Accordingly, it's possible to avoid the output-side load of the external detection module from going beyond its output-side capacity. In another aspect, the isolation and transfer module may be adjusted in its parameters so as to adjust its ability of impedance reduction, thereby no restriction of the geographical location or selective scope of the current monitor.

The content disclosed by the present application and the claimed scope will become more apparent from the following description of the embodiments with reference to drawings.

Figure 1:
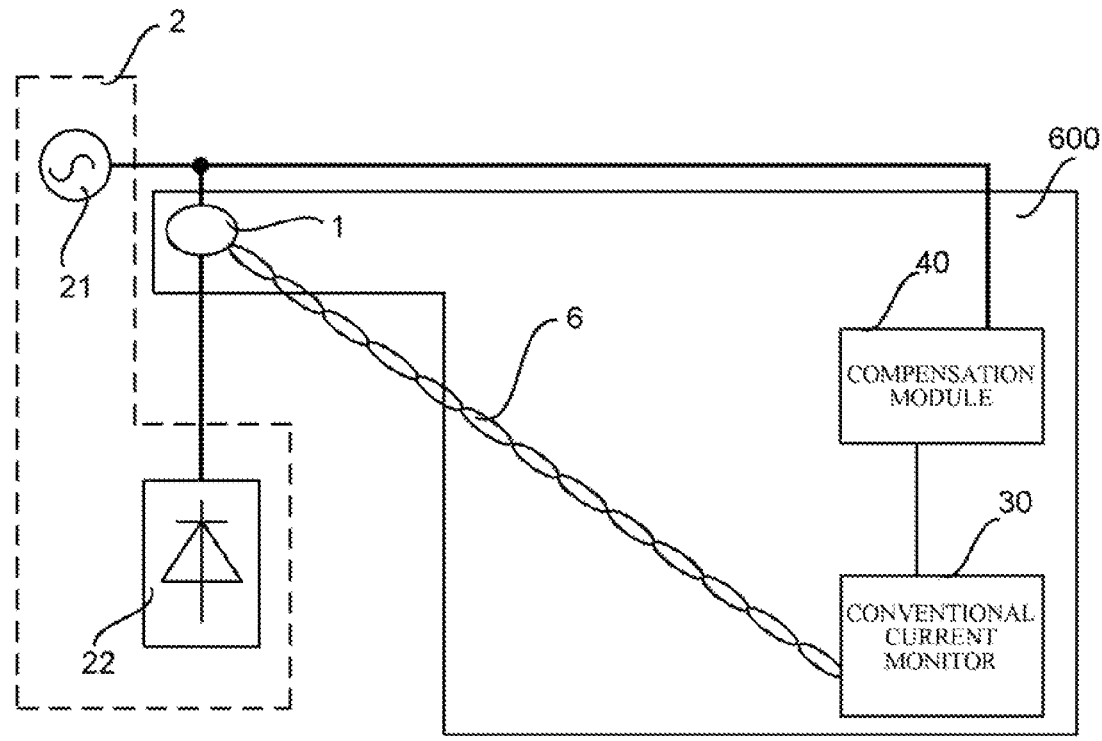
FIG. 1 illustratively shows an application example of an electric power quality compensation system in conventional technologies.
Figure 2:
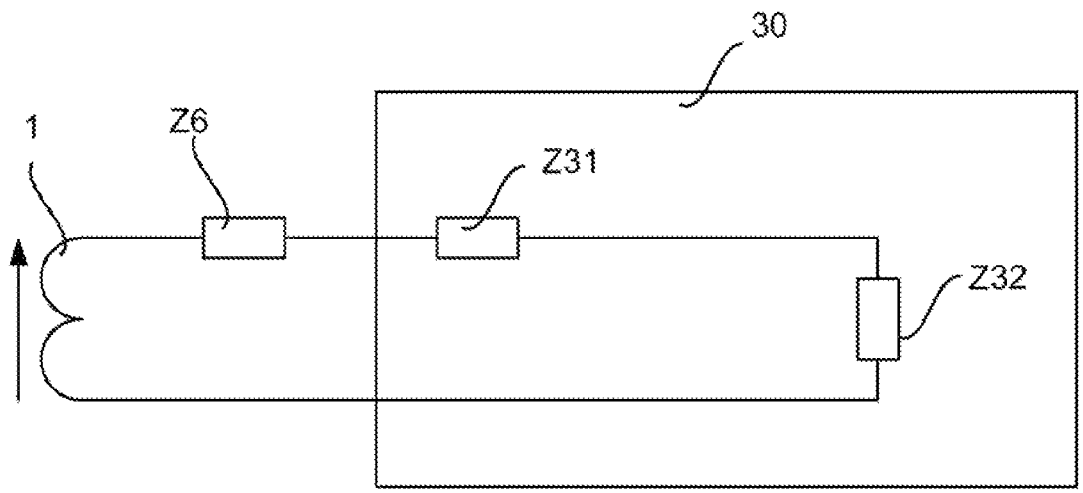
FIG. 2 illustratively shows an output-side load of an external detection module in conventional technologies.

Wherein:

600, 400: electric power quality compensation system
1: external detection module
40, 4: compensation module
41: compensation unit
30: conventional current monitor
2: external power network
21: power grid
22: non-linear load
6: external cable
3: current monitor
31: internal monitor module
32: isolation and transfer module
32a: input side
32b: output side
321, 322, . . . , 32X: isolation and transfer unit
310, 311, 312, . . . , 31H: internal monitor unit
INa, INb: input terminal
OUTc: output terminal
U1, U2, . . . , UN: isolation and transfer unit group
D1, D2, . . . , DN: internal monitor unit group
32a-1: first level transfer current transformer
32b-1, 32b-2 and 32b-3: second level transfer current transformer 8: Hall element
8a: primary side of Hall element
8b: secondary side of Hall element
1a: primary side of external detection module
1b: secondary side of external detection module
9a: primary side of interconnecting current transformer
9b: secondary side of interconnecting current transformer

DESCRIPTION OF EMBODIMENTS

Embodiments of the present application will be described below in detail. It should be noted that the embodiments described herein are for illustration purpose only and not to limit the present application.

Figure 3:
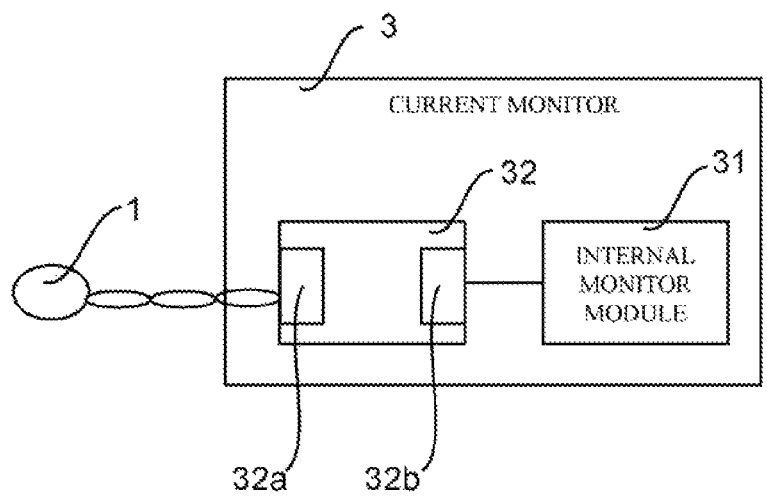
FIG. 3 illustratively shows a structure diagram of a current monitor according to a first embodiment of the present application.

FIG. 3 illustratively shows a structure diagram of a current monitor according to a first embodiment of the present application. The current monitor 3 includes an internal monitor module 31 and an isolation and transfer module 32. FIG. 3 also shows an external detection module 1 and illustrates the connection relationships between respective parts in the current monitor 3 and the external detection module 1.

The internal monitor module 31 outputs a measurement of current for characterizing a real-time electric power quality of an external power network based on a received detection current. The external detection module 1 detects a current of the external power network and outputs a first level detection current.

The isolation and transfer module 32 includes an input side 32a and an output side 32b which are electrically isolated from each other. The input side 32a is configured to be connected with the external detection module 1, for example, by an external cable. The output side 32b is configured to be connected with the internal monitor module 31. The isolation and transfer module 32 receives the first level detection current output from the external detection module 1 and outputs a second level detection current to the internal monitor module 31 so as to reduce the equivalent impedance of the internal monitor module 31 reflected to the external detection module 1. The internal monitor module 31, upon receiving the second level detection current, may output the measurement of current for characterizing the real-time electric power quality of the external power network. For example, the measurement of current may be used to characterize conditions of the harmonics generated in the external power network at present.

Compared with the conventional technologies, the isolation and transfer module 32 as shown in FIG. 3 is added into the current monitor 3. The isolation and transfer module 32 is connected between the external detection module 1 and an internal monitor module 31, and the internal monitor module 31 is equivalent to a load of the isolation and transfer module 32. The isolation and transfer module 32 may reduce the equivalent impedance of the internal monitor module 31 reflected to the external detection module 1.

In the embodiment as shown in FIG. 3, the isolation and transfer module 32 is added into the current monitor 3 and outputs the second level detection current to the internal monitor module 31 based on the first level detection current received from the external detection module 1, and thus plays a role of reducing the equivalent impedance of the internal monitor module 31 reflected to the external detection module 1. Accordingly, in the current monitor 3 disclosed by the present application, it's possible to avoid the output side of the external detection module 1 from being overloaded.

Furthermore, the ability of impedance reduction of the isolation and transfer module 32 may be adjusted by adjusting the parameters of the isolation and transfer module 32. For example, for a large equivalent impedance of the internal monitor module 31, an isolation and transfer module 32 with a greater reduction in impedance magnitude may be selected. Thus, with the current monitor 3 provided by the present application, no restriction of its geographical location or selective scope works.

Figure 4:
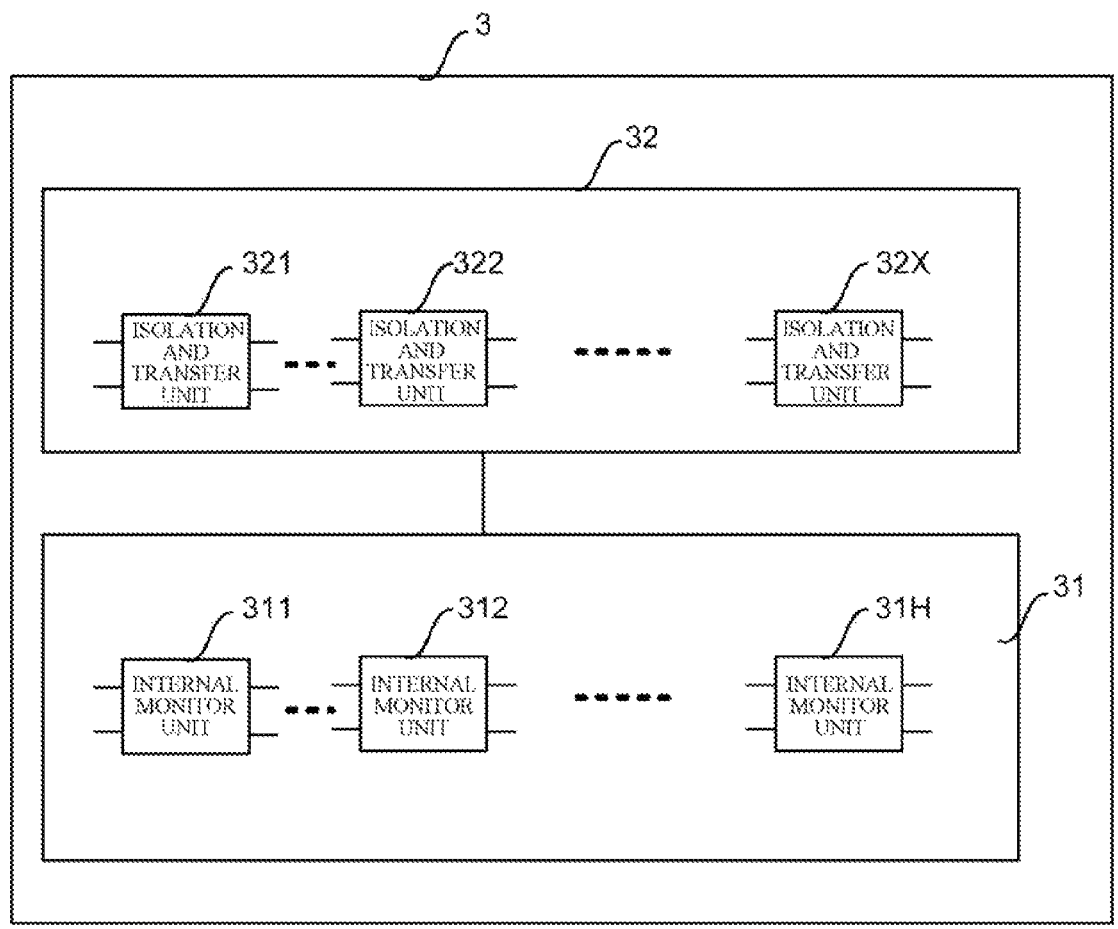
FIG. 4 illustratively shows a structure diagram of a current monitor according to a second embodiment of the present application.

FIG. 4 illustratively shows a structure diagram of a current monitor according to a second embodiment of the present application. The isolation and transfer module 32 includes X number of isolation and transfer units 321, 322, ..., 32X, and the internal monitor module 31 includes H number of internal monitor units 311, 312, ..., 31H. X and H are natural numbers greater than or equal to 1. The internal monitor unit is used to output a measurement of current for characterizing a real-time electric power quality of an external power network based on a received detection current, which for example may be implemented by a transformer, and the structure and function of which is well known to those skilled in the art.

When X is greater than 1, the input sides of the X number of isolation and transfer units are connected in series. The X numbers of isolation and transfer units are configured to receive the first level detection current.

The output sides of the above isolation and transfer units may be connected with an input end of one internal monitor unit, or may be connected with input ends of H or less number of internal monitor units such that the H or less number of internal monitor units receive respectively identical second level detection currents.

Specifically, when X equals to 1 and H equals to 1, an output side of that one isolation and transfer unit may be connected with an input end of that one internal monitor unit.

When X equals to 1 and H is greater than 1, an output side of that one isolation and transfer unit may be connected with the input ends of the H or less number of internal monitor units such that the H or less number of internal monitor units receive respectively identical second level detection currents.

When both of X and H are greater than 1, the output sides of a portion or all of the X number of isolation and transfer units are connected with the input ends of H or less number of internal monitor units such that the H or less number of internal monitor units receive respectively identical second level detection currents.

Particularly, when X=H, the output sides of the X number of isolation and transfer units may be connected with the input ends of the H number of internal monitor units respectively in a one-to-one correspondence.

In the embodiments of the present application, the input side(s) and the output side(s) of a portion or all of the isolation and transfer units in the isolation and transfer module may serve as the input side and the output side of the isolation and transfer module.

Figure 5:
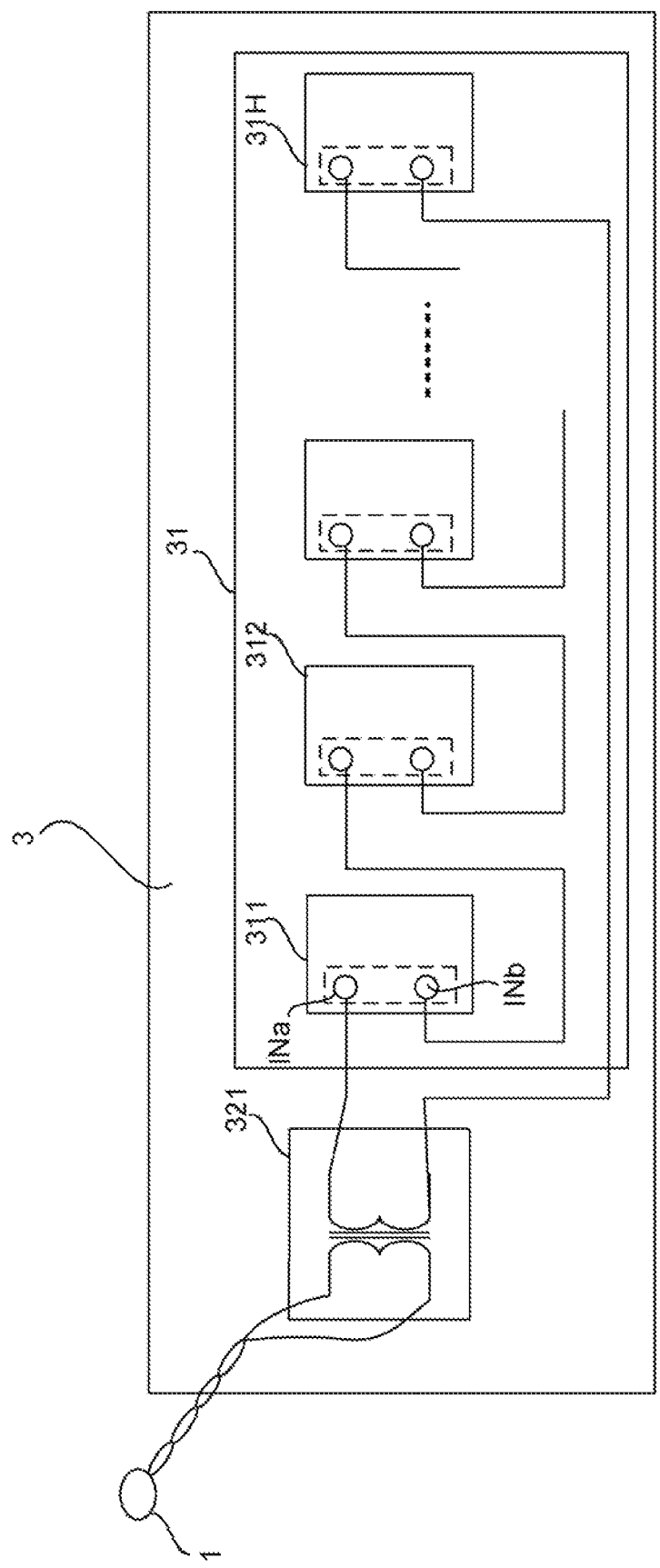
FIG. 5 illustratively shows a structure diagram of a current monitor according to a third embodiment of the present application.

In the embodiments of the present application, the isolation and transfer units may be implemented by current transformers. FIG. 5 illustratively shows a structure diagram of a current monitor according to a third embodiment of the present application. In FIG. 5, the isolation and transfer module includes one isolation and transfer unit, which is, for example, one transfer current transformer 321 having a primary side as an input side of the isolation and transfer unit and a secondary side as an output side of the isolation and transfer unit respectively. The internal monitor module 31 includes H numbers of internal monitor units 311, 312, ..., 31H, each of which has an input end including a pair of input terminals INa and INb. The input ends of the plurality of internal monitor units 311, 312, ... 31H may be connected in series. Specifically, an input terminal INb of one internal monitor unit may be connected with an input terminal INa of an immediately next internal monitor unit such that the plurality of internal monitor units receive respectively identical second level detection currents.

The secondary side of the transfer current transformer 321 may be connected with the first internal monitor unit 311 and the last internal monitor unit 31H, specifically being connected with an input terminal INa of the first detection unit 311 and an input terminal INb of the last internal monitor unit 31H. Such a way of connection makes the H or less number of internal monitor units to receive respectively identical second level detection currents.

The external detection module 1 may be an external current transformer having a primary side as an input side of the external detection module 1 and a secondary side as an output side of the external detection module 1. The primary side of the transfer current transformer 321 may be connected with the secondary side of the external current transformer 1, and the secondary side of the transfer current transformer 321 may be connected with the plurality of internal monitor units 311, 312, . . . , 31H. Specifically, as shown in FIG. 5, the secondary side of the transfer current transformer 321 is connected with an input end of the first internal monitor unit 311 (i.e., connected with the input terminal INa of the first internal monitor unit 311) and an input end of the last internal monitor unit 31H (i.e., connected with the input terminal INb of the internal monitor unit 31H) among the plurality of internal monitor units.

The operating principles of the current monitor shown in FIG. 5 will be described as below.

The transfer current transformer 321, with the secondary side of which being connected with the internal monitor module 31, has an secondary-side impedance including an equivalent impedance of the connection wires among the plurality of internal monitor units 311, 312, . . . , 31H in the internal monitor module 31 and an equivalent impedance of the measurement loops in the plurality of internal monitor units 311, 312, . . . , 31H. By adjusting the turns ratio of the transfer current transformer 321, the equivalent impedance converted from the secondary side of the transfer current transformer 321 to the primary side of the transfer current transformer 321 may be reduced. With the primary side of the transfer current transformer 321 being connected with the secondary side of the external current transformer 1, the equivalent impedance of the primary side of the transfer current transformer 321 may be considered as the secondary-side load of the external current transformer 1. The equivalent impedance of the secondary side of the transfer current transformer 321 reflected to its primary side could be reduced in order to meet secondary-side capacity of external current transformer 1.

It can be seen that, with the current monitor shown in FIG. 5, the equivalent impedance of the secondary side of the transfer current transformer 321 reflected to its primary side may be reduced by adjusting the turns ratio of the transfer current transformer 321, no matter how much big the equivalent impedance of the internal monitor module 31 is. That is to say, the internal monitor module 31 is no longer subjected to the restriction of the secondary-side load or capacity of the external current transformer 1, and it's possible to avoid the problem of inaccurate current detection caused by the over large secondary-side load of the external current transformer going beyond its secondary-side capacity, and to allow more flexibility in configuration of the internal monitor module.

In the embodiment as shown in FIG. 5, the internal monitor module 31 includes a plurality of internal monitor units 311, 312, . . . , 31H. Alternatively, the internal monitor module 31 may include only one internal monitor unit such as the internal monitor unit 311. The secondary side of the transfer current transformer 321 may be connected with the two terminals INa and INb of the internal monitor unit 311.

Figure 6:
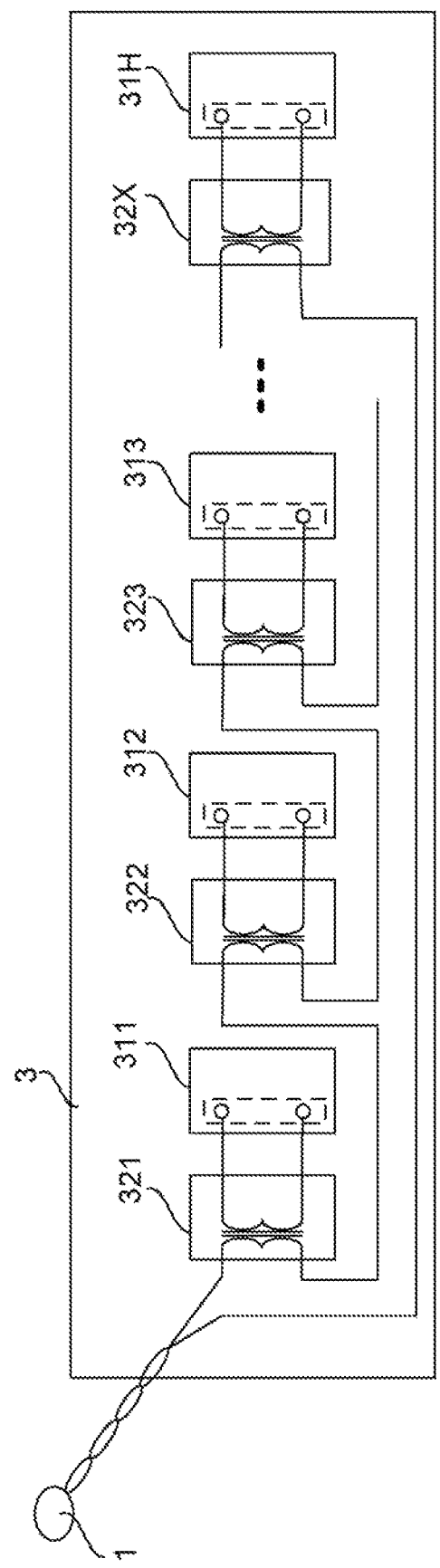
FIG. 6 illustratively shows a structure diagram of a current monitor according to a fourth embodiment of the present application.

FIG. 6 illustratively shows a structure diagram of a current monitor according to a fourth embodiment of the present application. In FIG. 6, the isolation and transfer module includes a plurality of isolation and transfer units such as the X number of transfer current transformers 321, 322, . . . , 32X, with the primary sides of these current transformers being connected in series. A primary side of the first transfer current transformer 321 and a primary side of the last transfer current transformer 32X are connected with the secondary side of the external current transformer 1. The internal monitor module may include a plurality of internal monitor units 311, 312, . . . , 31H. In this embodiment, the number of the isolation and transfer units equals to the number of the internal monitor units, i.e., X=H. The output sides of the plurality of isolation and transfer units are connected with the input ends of the plurality of internal monitor units respectively in a one-to-one correspondence.

In the current monitor as shown in FIG. 6, the turns ratio of each of the transfer current transformers 321, 322, . . . , 32X and the number of the transfer current transformers included in the isolation and transfer module may be set according to the equivalent impedance of the internal monitor module and the secondary-side capacity of the external current transformer 1, such that the isolation and transfer module may play a role of reducing the impedance of the internal monitor module reflected to the external current transformer 1.

In FIGS. 5 and 6, the isolation and transfer units are illustrated as to be implemented by current transformers for example. However, the isolation and transfer units in the embodiments of the present application are not limited to the current transformers, and other devices capable of reducing the equivalent impedance reflected from the output side to the input side may be used.

In the current monitor provided by the embodiments of the present application, the isolation and transfer module may include multiple levels of isolation and transfer units.

Figure 7:
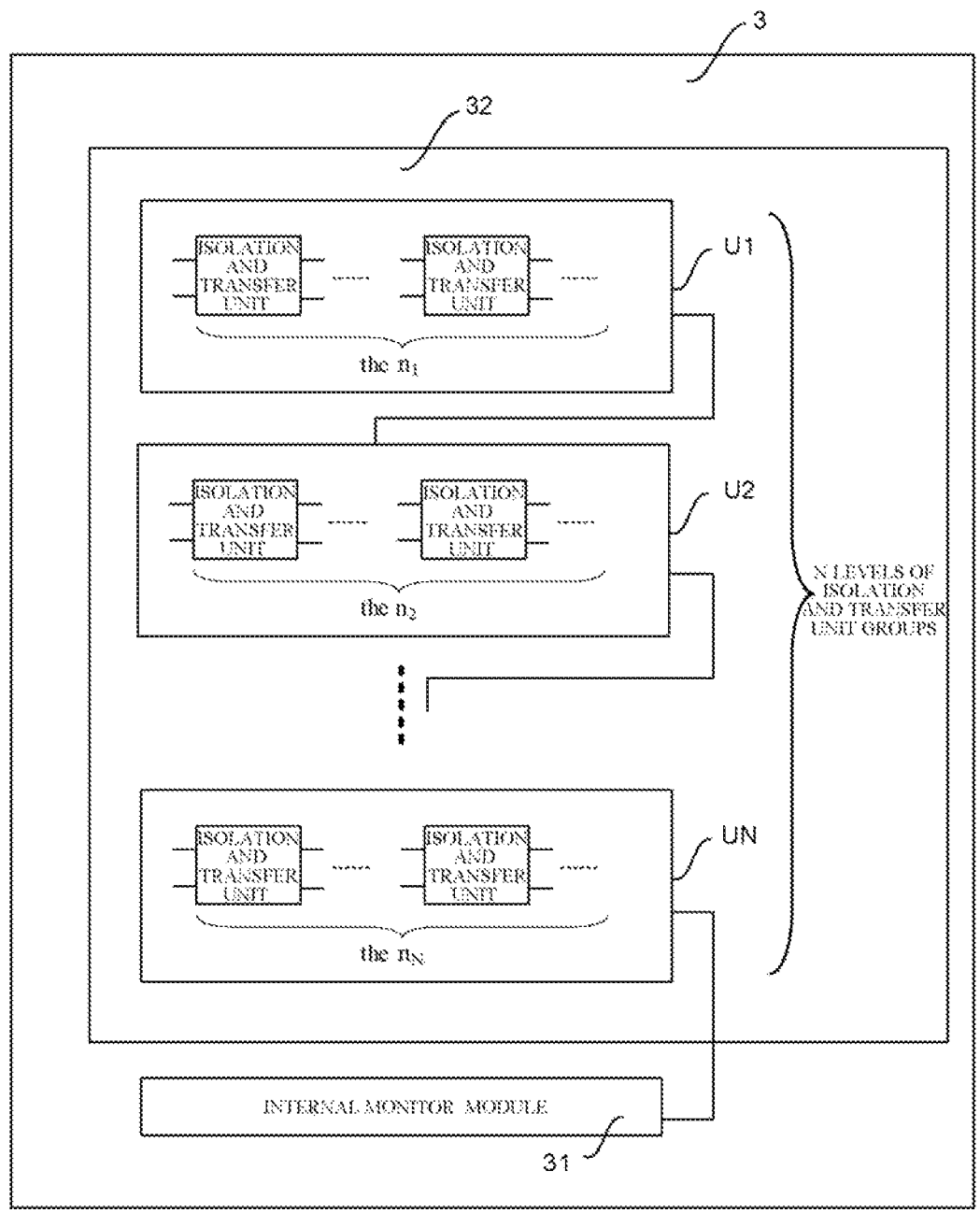
FIG. 7 illustratively shows a structure diagram of a current monitor according to a fifth embodiment of the present application.

FIG. 7 illustratively shows a structure diagram of a current monitor according to a fifth embodiment of the present application. The isolation and transfer module 32 includes N levels of isolation and transfer unit groups U1, U2, . . . , UN, wherein the i-th level isolation and transfer unit group includes $n_i$ number of isolation and transfer units, i may be a natural number selected from 1, 2, . . . , N, N is a natural number greater than or equal to 2, and $n_i$ is a natural number greater than or equal to 1.

An input side of the first level isolation and transfer unit group U1 is connected with an output side of the external detection module 1, and an input side of the i-th level isolation and transfer unit group is connected with an output side of the (i−1)-th level isolation and transfer unit group. In every level of isolation and transfer unit group, the input side(s) and the output side(s) of a portion or all of the isolation and transfer units may serve as the input side and the output side of this group.

The internal monitor module 31 includes one or more internal monitor units, and the output side of the N-th level isolation and transfer unit group is connected with the input end of the internal monitor module 31.

When the number $n_i$ of the isolation and transfer units included in the i-th level isolation and transfer unit group is greater than the number $n_{i-1}$ of the isolation and transfer units included in the (i−1)-th level isolation and transfer unit group, the input sides of at least two isolation and transfer units included in the i-th level isolation and transfer unit group are connected in series; when the number $n_i$ of the isolation and transfer units included in the i-th level isolation and transfer unit group is less than the number $n_{i-1}$ of the isolation and transfer units included in the (i−1)-th level isolation and transfer unit group, the output sides of at least two isolation and transfer units included in the (i−1)-th level isolation and transfer unit group are connected in series.

Figure 8:
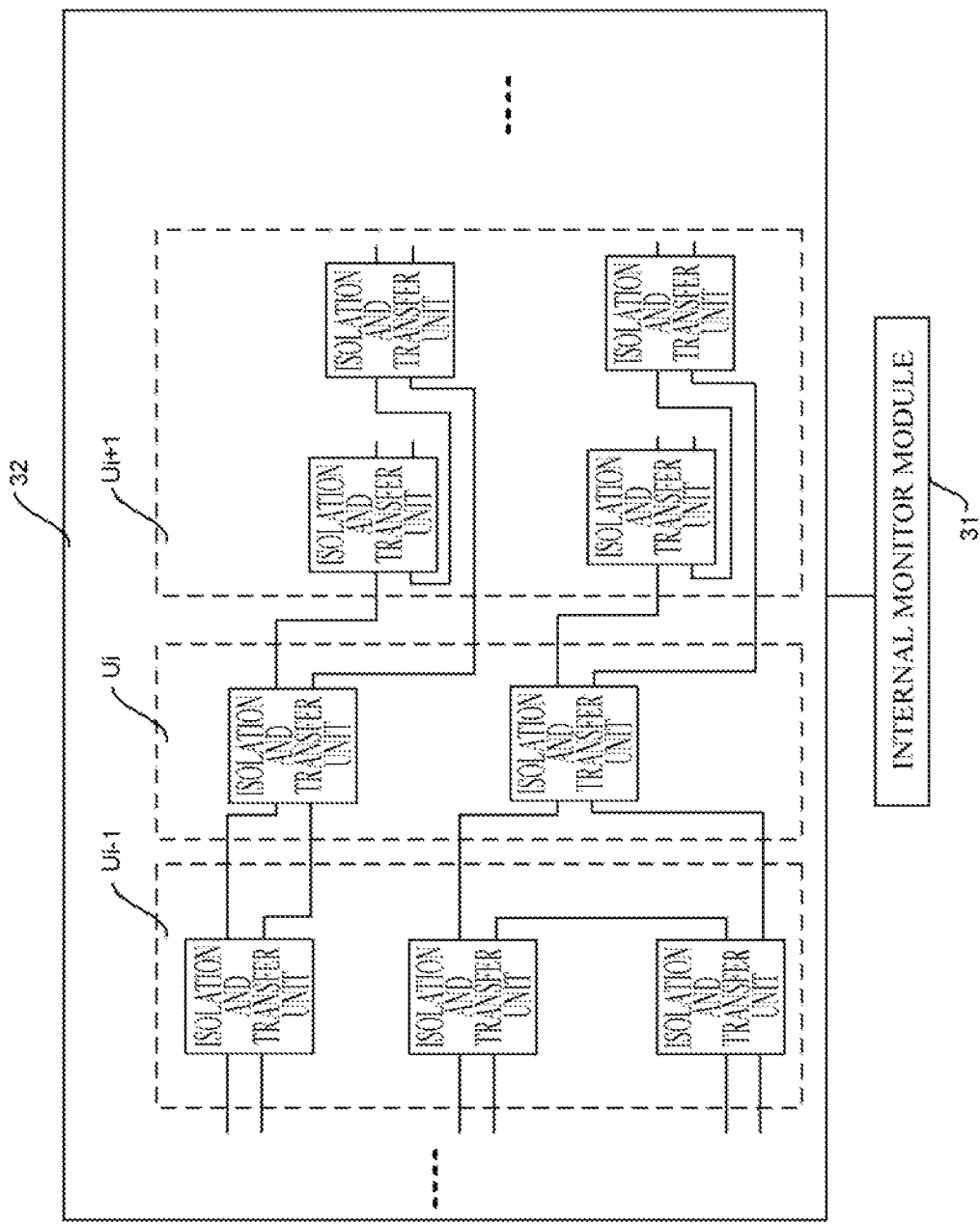
FIG. 8 illustratively shows a structure diagram of a current monitor according to a sixth embodiment of the present application.

FIG. 8 illustratively shows a structure diagram of a current monitor according to a sixth embodiment of the present application. In this embodiment, primarily, the (i−1)-th level isolation and transfer unit group Ui−1, the i-th level isolation and transfer unit group Ui, and the (i+1)-th level isolation and transfer unit group Ui+1 in the isolation and transfer module 32 are illustrated as an example. The numbers of the isolation and transfer units included in the isolation and transfer unit groups Ui−1, Ui and Ui+1 may be three, two and four respectively, for example.

The number (i.e., four) of the isolation and transfer units included in the (i+1)-th level isolation and transfer unit group Ui+1 is greater than the number (i.e., two) of the isolation and transfer units included in the i-th level isolation and transfer unit group Ui, and thus the input sides of at least two isolation and transfer units included in the (i+1)-th level isolation and transfer unit group Ui+1 are connected in series. For example, in the (i+1)-th level isolation and transfer unit group Ui+1 as shown in FIG. 8, the input sides of the upper two isolation and transfer units are connected in series and the input sides of the lower two isolation and transfer units are connected in series.

The number (i.e., two) of the isolation and transfer units included in the i-th level isolation and transfer unit group Ui is less than the number (i.e., three) of the isolation and transfer units included in the (i−1)-th level isolation and transfer unit group Ui−1, and thus the output sides of at least two isolation and transfer units included in the (i−1)-th level isolation and transfer unit group Ui−1 are connected in series. For example, in the (i−1)-th level isolation and transfer unit group Ui−1 as shown in FIG. 8, the output sides of the lower two isolation and transfer units are connected in series.

Figure 9:
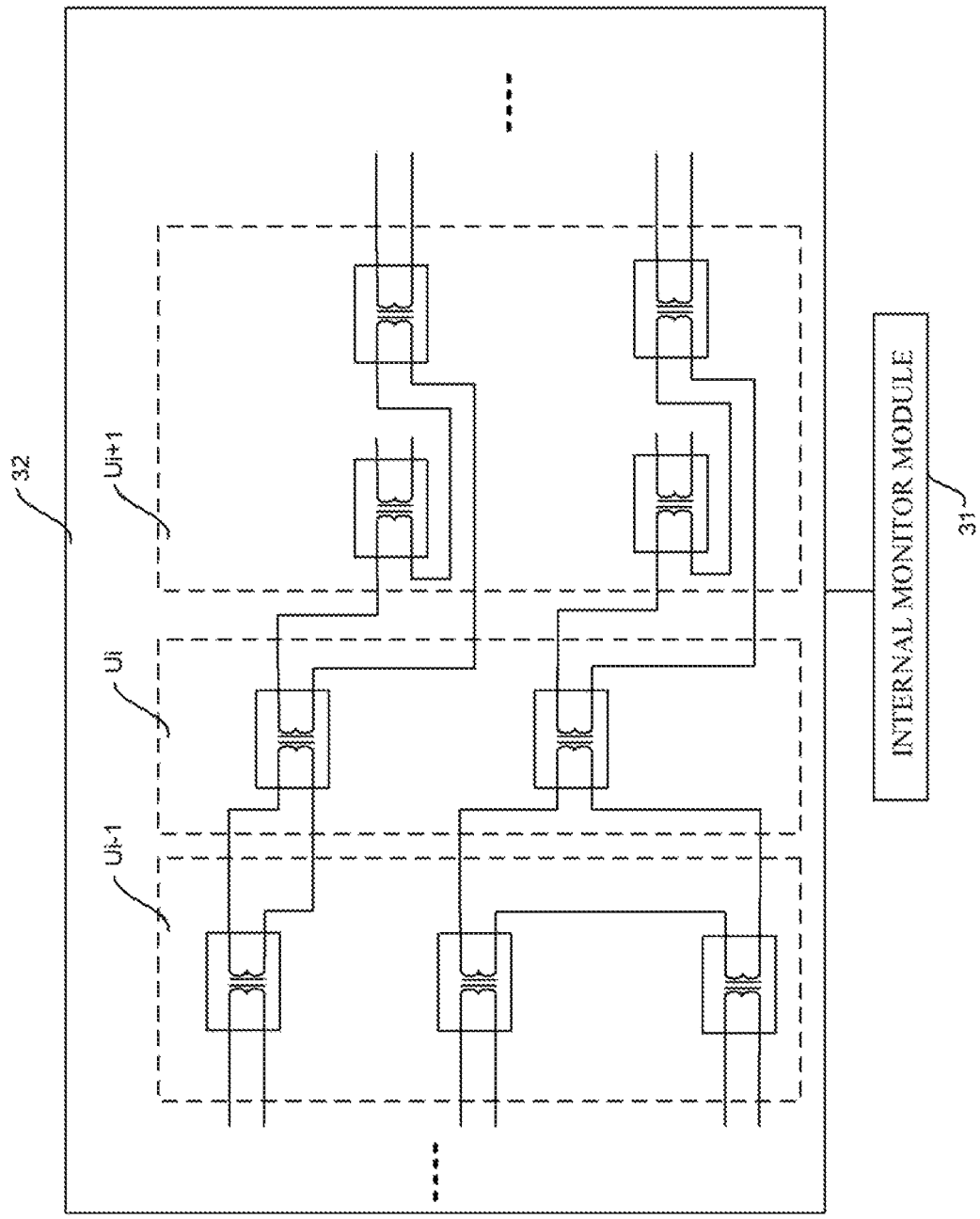
FIG. 9 illustratively shows a structure diagram of a current monitor according to a seventh embodiment of the present application.

In the embodiments of the present application, the isolation and transfer units may be implemented by current transformers. FIG. 9 illustratively shows a structure diagram of a current monitor according to a seventh embodiment of the present application. In FIG. 9, each of the isolation and transfer units is an interconnecting current transformer, and the primary side and the secondary side of each interconnecting current transformer serve as the input side and the output side of the isolation and transfer unit respectively.

In the embodiments of the present application, the plurality of internal monitor units included in the internal monitor module may be divided into a plurality of internal monitor unit groups, and then respective internal monitor unit groups are connected with respective isolation and transfer units included in the N-th level isolation and transfer unit group.

Figure 10:
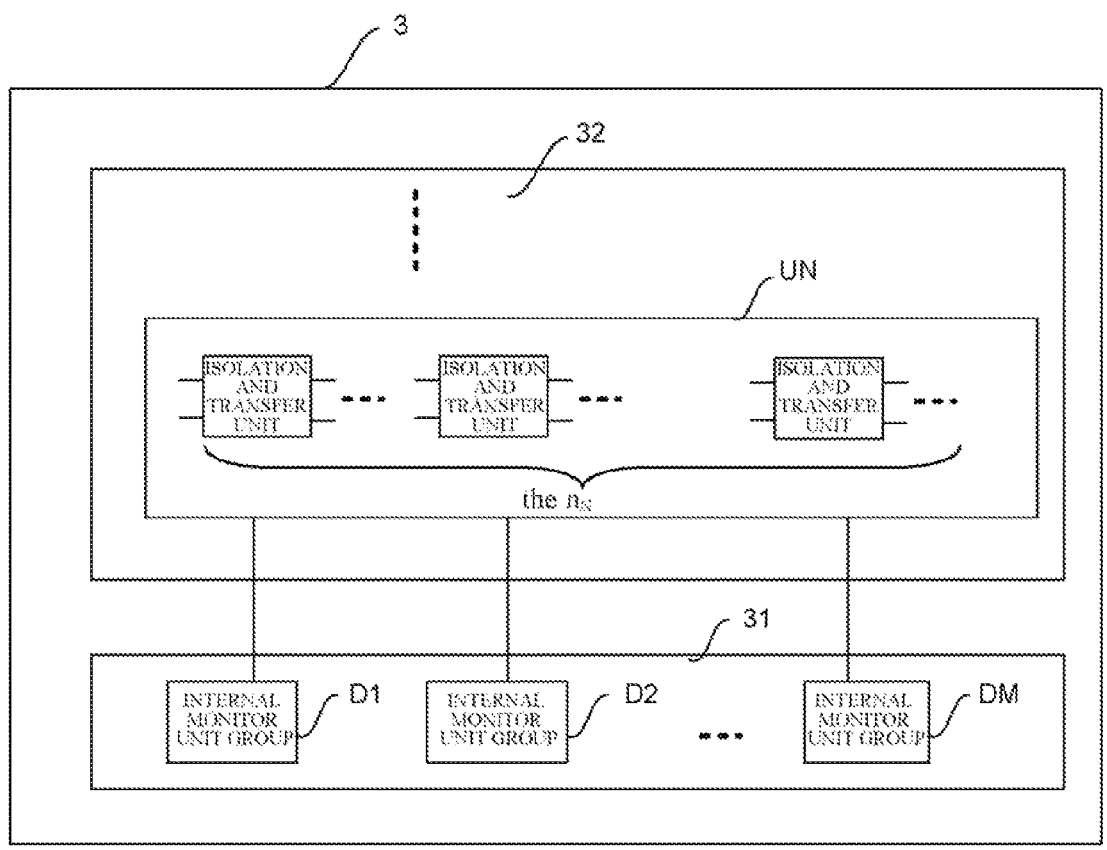
FIG. 10 illustratively shows a structure diagram of a current monitor according to an eighth embodiment of the present application.

FIG. 10 illustratively shows a structure diagram of a current monitor according to an eighth embodiment of the present application. The internal monitor module 31 includes H number of internal monitor units to be divided into M number of internal monitor unit groups D1, D2, . . . , DM. Both of H and M are natural numbers greater than or equal to 1, and H is greater than or equal to M. The N-th level isolation and transfer unit group includes $n_N$ number of isolation and transfer units, and M equals to $n_N$. When H=M, i.e., every internal monitor unit group includes only one internal monitor unit, the output sides of the $n_N$ number of isolation and transfer units in the N-th level isolation and transfer unit group are connected with the input ends of the M number of internal monitor unit group respectively in a one-to-one correspondence. When H is greater than M, i.e., at least one internal monitor unit group includes more than one internal monitor units, the output sides of the isolation and transfer units in the N-th level isolation and transfer unit group are connected with the input end of the internal monitor unit group, which includes a plurality of internal monitor units such that the internal monitor units in the internal monitor unit group receive respectively identical second level detection currents.

Some specific examples are given as below to show the connection relationships between the internal monitor units and the isolation and transfer units.

Figure 11:
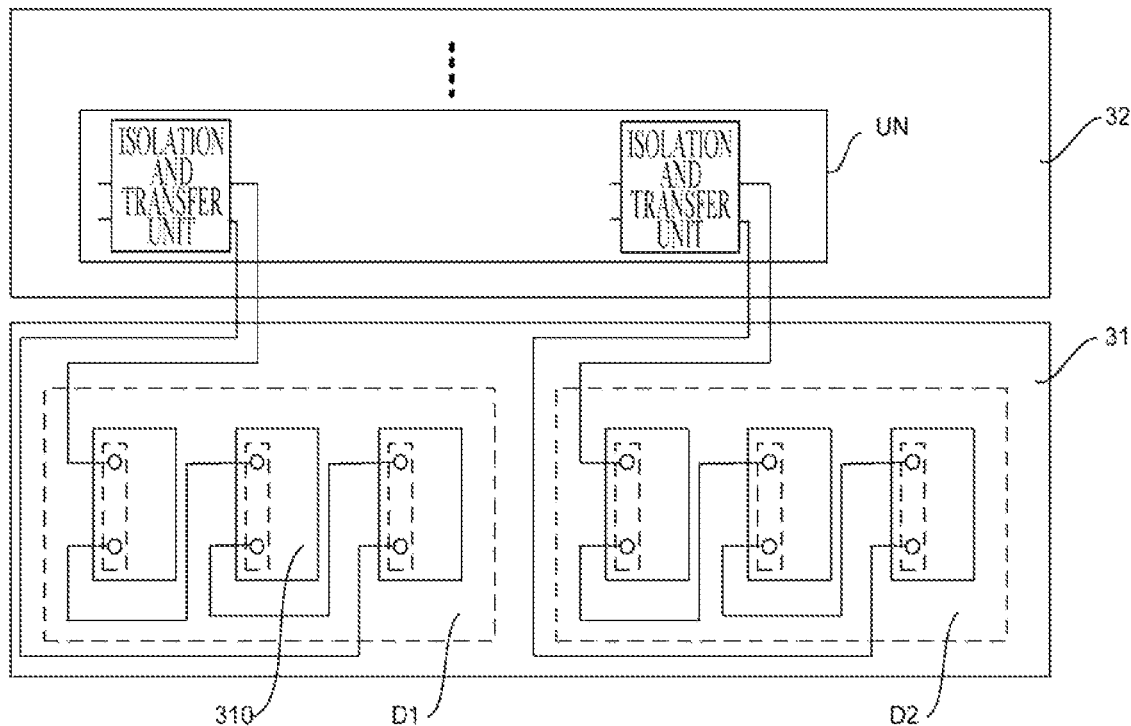
FIG. 11 illustratively shows a structure diagram of a current monitor according to a ninth embodiment of the present application.

FIG. 11 illustratively shows a structure diagram of a current monitor according to a ninth embodiment of the present application. In this embodiment, the internal monitor module 31 includes six internal monitor units 310 which are divided into two internal monitor unit groups D1 and D2, each of which includes three internal monitor units. That is to say, H is greater than M, and each internal monitor unit group includes more than one internal monitor units. The N-th level isolation and transfer unit group UN includes two isolation and transfer units. In the illustration of FIG. 11, the input sides of a plurality of internal monitor units in the same internal monitor unit group are connected in series and then serve as the input end of the internal monitor unit group. Thus, the output side of each isolation and transfer unit is connected with an input end of one internal monitor unit group, such that the internal monitor units in one internal monitor unit group may receive respectively identical second level detection currents.

Figure 12:
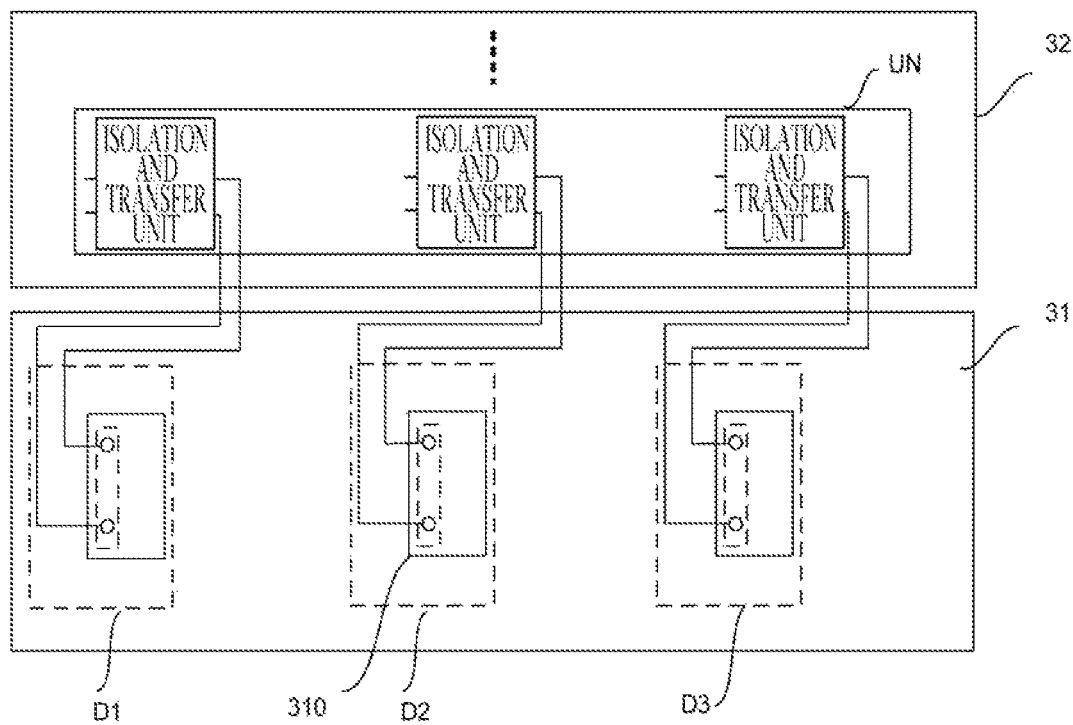
FIG. 12 illustratively shows a structure diagram of a current monitor according to a tenth embodiment of the present application.

FIG. 12 illustratively shows a structure diagram of a current monitor according to a tenth embodiment of the present application. In this embodiment, the internal monitor module 31 includes three internal monitor units 310 which are divided into three internal monitor unit groups D1, D2 and D3, i.e., H=M. The N-th level isolation and transfer unit group UN includes three isolation and transfer units. Because every internal monitor unit group includes only one internal monitor unit 310, the three isolation and transfer units are connected with the input ends of the three internal monitor unit groups respectively in a one-to-one correspondence.

Figure 13:
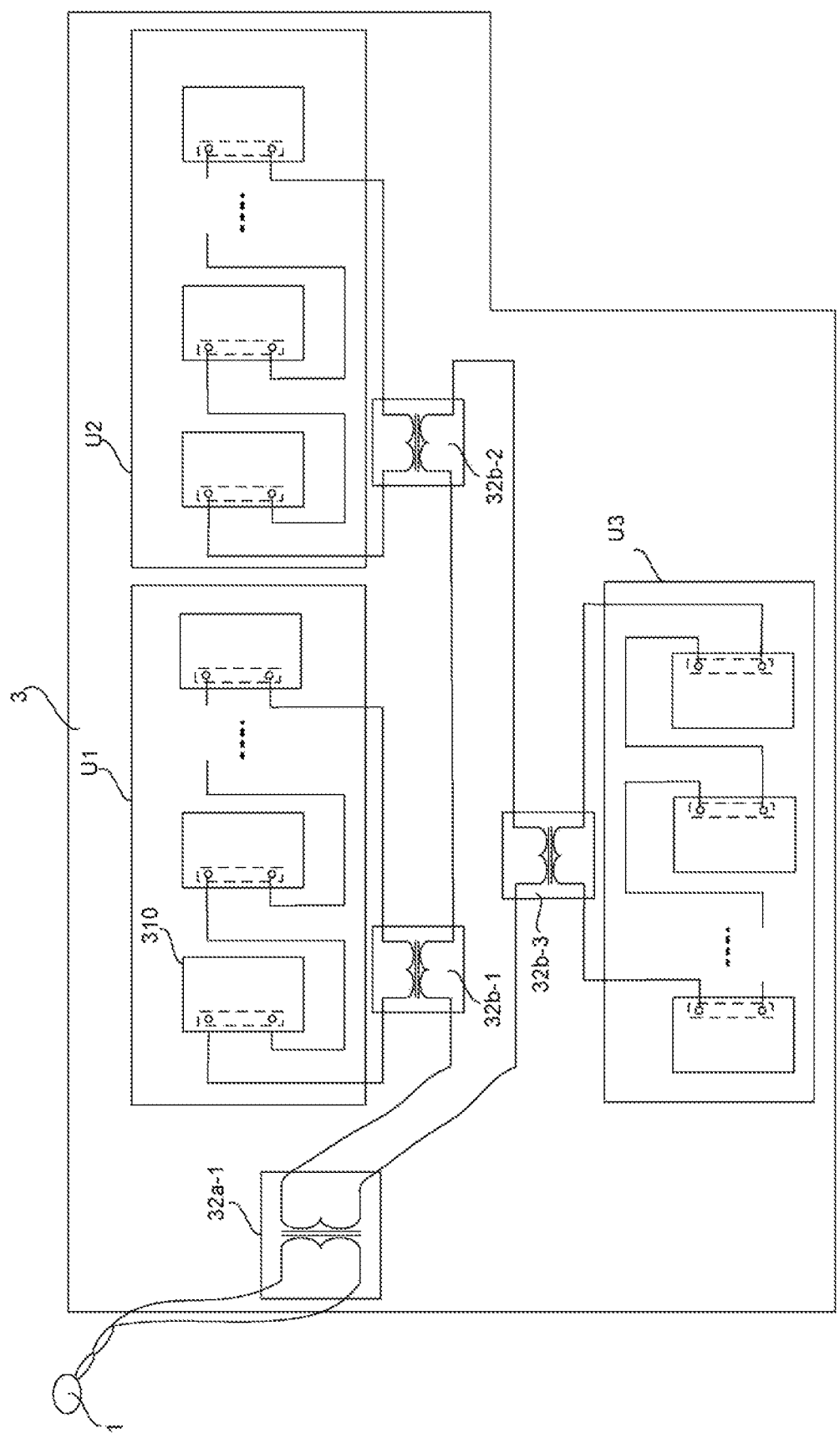
FIG. 13 illustratively shows a structure diagram of a current monitor according to an eleventh embodiment of the present application.

FIG. 13 illustratively shows a structure diagram of a current monitor according to an eleventh embodiment of the present application. In this embodiment, the isolation and transfer module includes two levels of isolation and transfer unit groups. The first level isolation and transfer unit group includes one first level isolation and transfer unit, and the second isolation and transfer unit group includes three second level isolation and transfer units. The first level isolation and transfer unit may be the first interconnecting current transformer 32a-1, and the three second level isolation and transfer units may be the second interconnecting current transformers 32b-1, 32b-2 and 32b-3 with the primary sides thereof being connected in series.

The internal monitor module may include a plurality of internal monitor units 310 which are divided into three internal monitor unit groups U1, U2 and U3, each of which may include one or more internal monitor units 310.

The primary side of the first level interconnecting current transformer 32a-1 is connected with the secondary side of the external current transformer 1, and the secondary side of the first level interconnecting current transformer 32a-1 is connected with the primary sides of the second level interconnecting current transformers 32b-1, 32b-2 and 32b-3.

The secondary side of each of the second level interconnecting current transformers 32b-1, 32b-2 and 32b-3 is connected with the internal monitor unit(s) 310 in the internal monitor unit groups U1, U2 and U3 respectively. For example, the secondary side of the second level transfer current transformer 32b-1 is connected with the input ends of the first internal monitor unit and the last internal monitor unit in the internal monitor unit group U1. The secondary sides of the second level interconnecting current transformers 32b-2 and 32b-3 are connected with the internal monitor units in the internal monitor unit groups U2 and U3 similarly as that of the interconnecting current transformer 32b-1, and detailed descriptions thereof will be omitted.

In the current monitor as shown in FIG. 13, only two levels of isolation and transfer unit groups are illustrated. Alternatively, more levels of isolation and transfer unit groups may be provided according to the equivalent impedance of the internal monitor module and the secondary-side capacity of the external current transformer. The turns ratio of each interconnecting current transformer may be set according to actual requirements. Specifically, the larger the number of the internal monitor units is, and the longer the lengths of the wires between the internal monitor units is, the larger the load of the internal monitor units will be, and thus the number of the interconnecting current transformers to be added may be increased or larger capacities of the interconnecting current transformers may be needed.

In the foregoing embodiments, the isolation and transfer module is illustrated as to be implemented by current transformers for example. In applications, Hall elements are usually used to detect the current of the external power network as well. If an external Hall element used to detect the current of the external power network has a large secondary-side resistance, the external Hall element will output a constant current which may result in an output voltage going beyond the power supply voltage for the Hall element, and the measurement accuracy will be deteriorated.

In the cases where Hall current sensors are used to sample a current, the interconnecting Hall elements may be adopted similarly to reduce the equivalent impedance of the internal monitor module reflected to the external Hall elements. The interconnecting current transformers in the foregoing embodiments may be replaced by the interconnecting Hall elements (see the Hall element 8 in FIG. 19), or the external current transformer may be replaced by an external Hall element. Specifically, in a current monitor, an input side of an interconnecting Hall element may be connected with the output side of the external Hall element, and an output side of the interconnecting Hall element may be connected with the internal monitor module. Thus, the interconnecting Hall element may reduce the equivalent impedance of the internal monitor module reflected to the external Hall element. Therefore, it's possible to avoid the problem caused by the output-side overload of the external Hall element.

Figure 19:
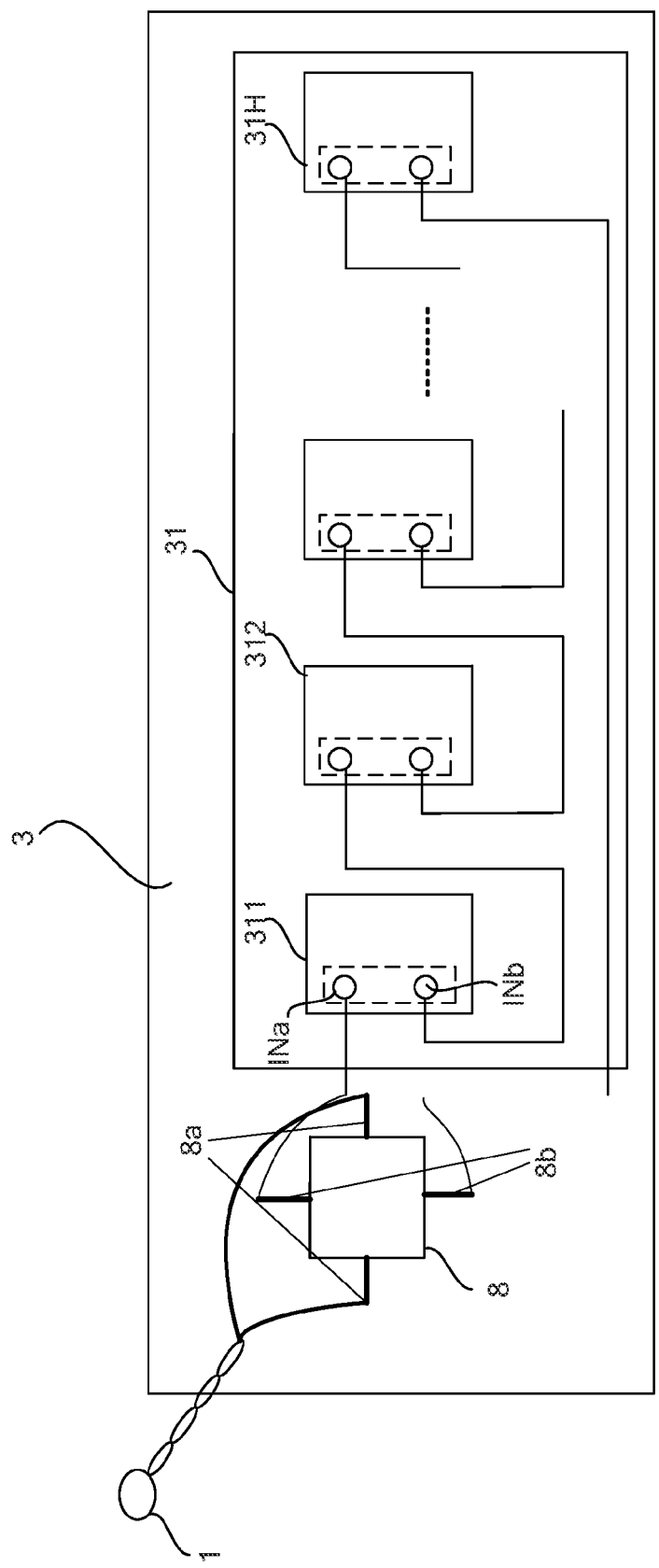
FIG. 19 illustratively shows a structure diagram of a current monitor according to an embodiment of the present application.

In FIG. 19, the isolation and transfer unit is a Hall element 8, the input side of the isolation and transfer unit is the primary side 8a of the Hall element 8, and the output side of the isolation and transfer unit is the secondary side 8b of the Hall element 8.

In the current monitor implemented by Hall elements, the parameters of the interconnecting Hall elements may be set according to the equivalent impedance of the internal monitor module and the secondary-side capacity of the external Hall element, such that the interconnecting Hall element may play a role of reducing the equivalent impedance of the internal monitor module reflected to the external Hall element.

In the current monitor illustrated in the present application, no matter what kind of structures are adopted in the current monitor, the main object is to reduce the impedance of the internal monitor module reflected to the external detection module by means of the isolation and transfer module so as to avoid the problem caused by a over large impedance of the internal monitor module. Thus, based on the related electric parameters of the actual internal monitor modules and external detection modules, for the design of the current monitor, it is expected in principle that structures of actual isolation and transfer modules are as simple as possible and the number of the isolation and transfer units to be adopted is as small as possible, so that the current monitor may have a compact structure or a reduced cost.

Embodiments of the electric power quality compensation systems provided by the present application will be described as below.

Figure 14:
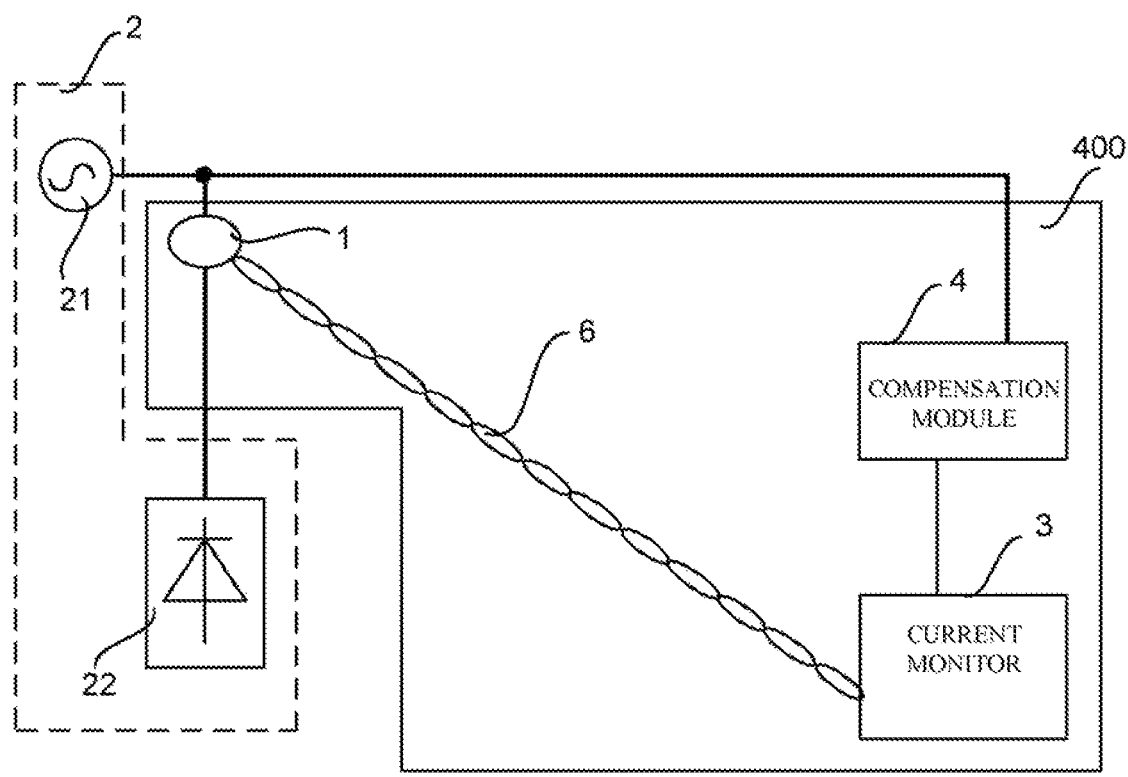
FIG. 14 illustratively shows a structure diagram of an electric power quality compensation system according to a first embodiment of the present application.

FIG. 14 illustratively shows a structure diagram of an electric power quality compensation system according to a first embodiment of the present application. In the system 400, a compensation module 4 configured to compensate the electric power quality of an external power network 2 is connected with a current monitor 3. As shown in FIG. 14, the external power network 2 includes a power grid 21 and a non-linear load 22 connected with the power grid.

For example, the compensation module 4 may compensate the reactive power consumptions generated by the non-linear load 22 and/or suppress the harmonics generated by the non-linear load 22 in the external power network. The system 400 may be an Active Power Filter (APF) system, a Static Var Generator (SVG) system or a Dynamic Voltage Regulator (DVR) system, etc. The embodiments of the current monitor are given in detail in above descriptions and thus will not be described repeatedly here.

The compensation module 4 may include a plurality of compensation units, and the internal monitor module may include a number of internal monitor units identical to the number of the compensation units. The plurality of compensation units, which may be connected with the external power network in parallel, may be connected with the plurality of internal monitor units respectively in a one-to-one correspondence. For example, the compensation unit is generally implemented by a compensator performing a function of power quality compensation, which may be a passive compensator, a harmonic compensator or a passive harmonic compensator, and the structure and function of which is well known to those skilled in the art.

Figure 15:
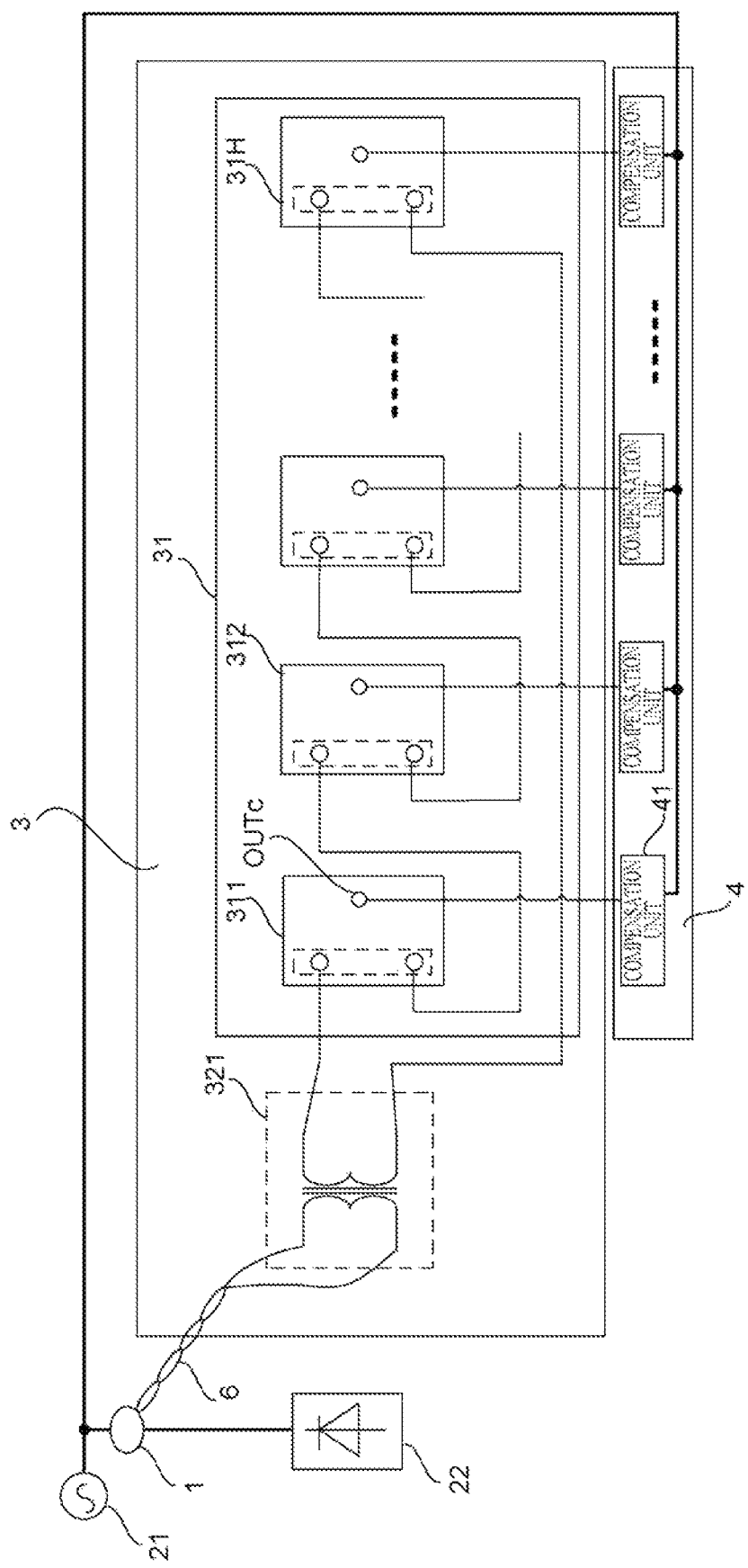
FIG. 15 illustratively shows a structure diagram of an electric power quality compensation system according to a second embodiment of the present application.

FIG. 15 illustratively shows a structure diagram of an electric power quality compensation system according to a second embodiment of the present application. The electric power quality compensation system includes the current monitor 3 as shown in FIG. 5, and a compensation module 4 including a plurality of compensation units 41 each connected with one of the internal monitor units respectively. Specifically, each of the compensation units 41 may be connected with an output terminal OUTc of the internal monitor unit. Each of the compensation units 41 may compensate the external power network based on the measurement of current output from the corresponding internal monitor unit.

Figure 16:
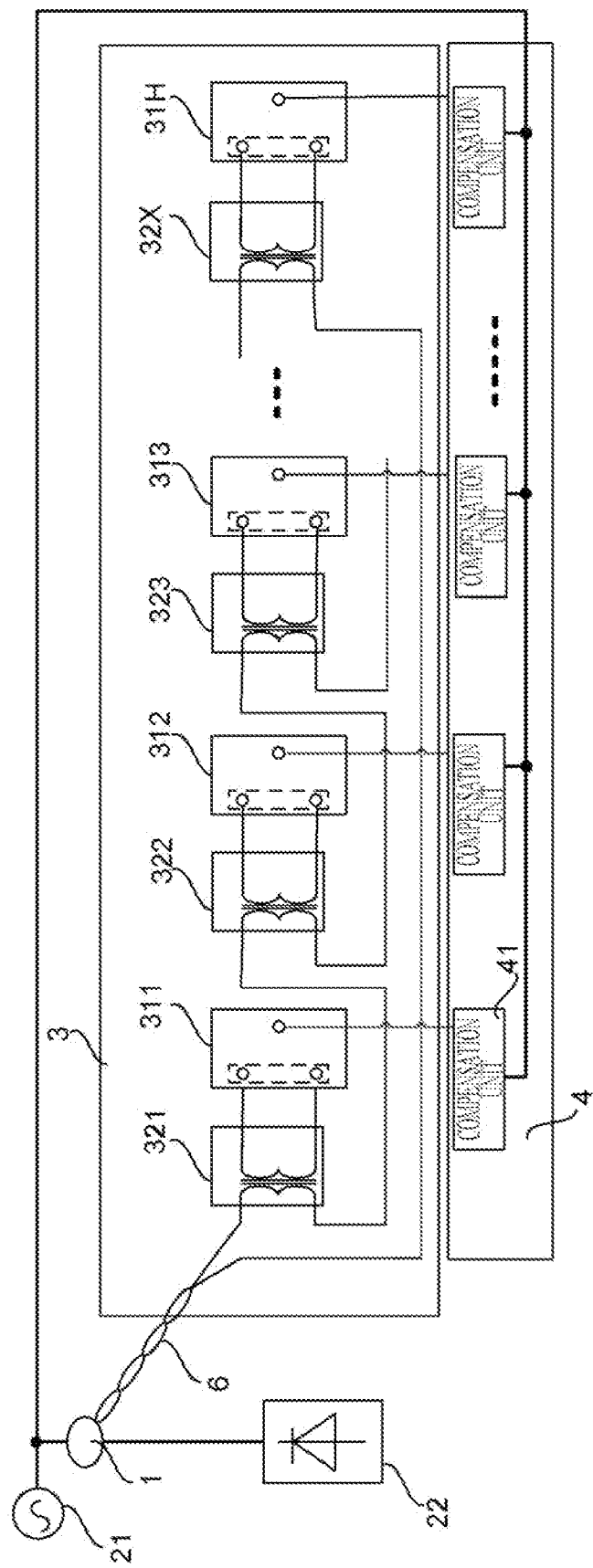
FIG. 16 illustratively shows a structure diagram of an electric power quality compensation system according to a third embodiment of the present application.
Figure 17:
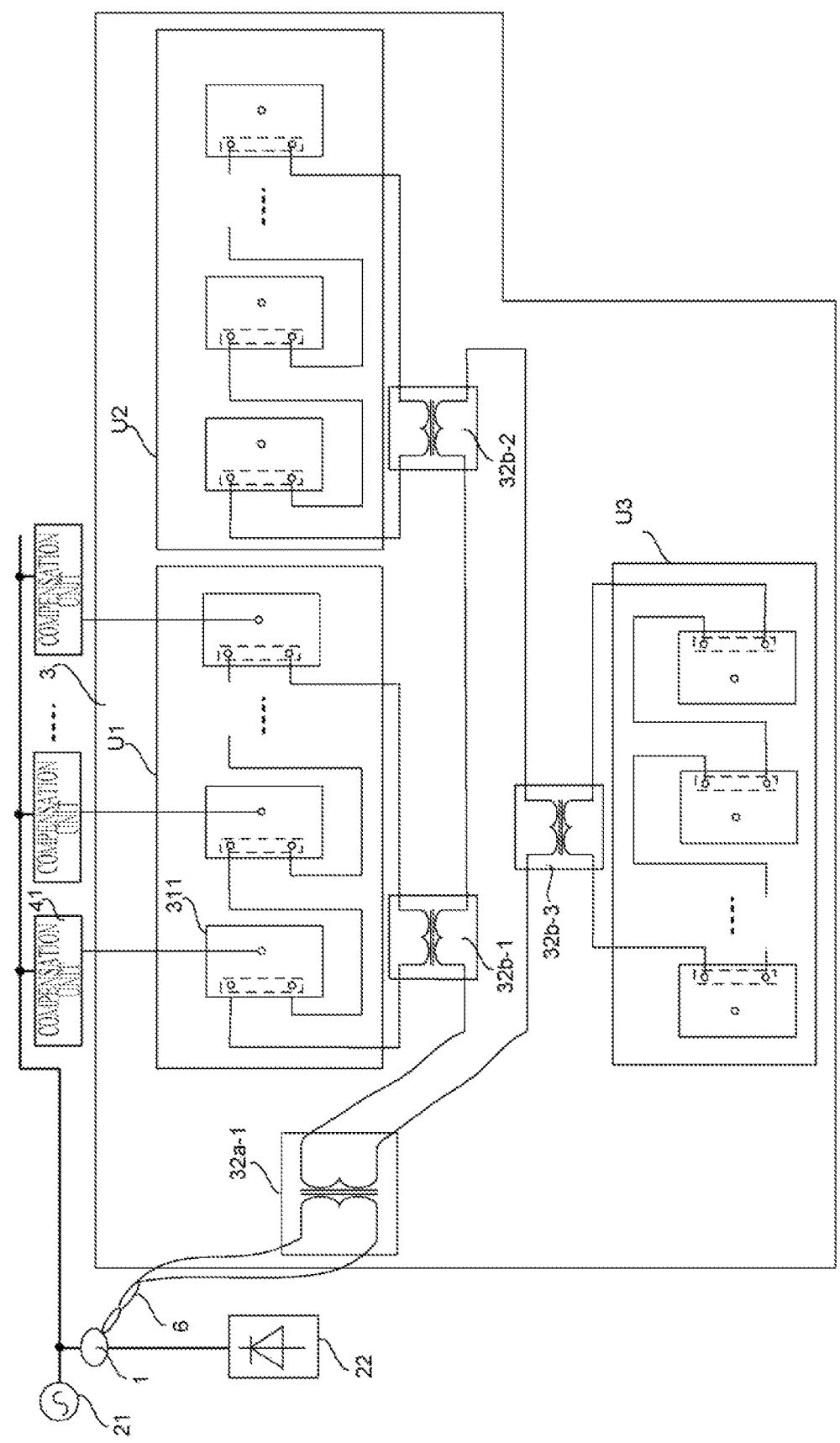
FIG. 17 illustratively shows a structure diagram of an electric power quality compensation system according to a fourth embodiment of the present application.

FIG. 16 illustratively shows a structure diagram of an electric power quality compensation system according to a third embodiment of the present application. The electric power quality compensation system includes the current monitor 3 as shown in FIG. 6 and a plurality of compensation units 41. FIG. 17 illustratively shows a structure diagram of an electric power quality compensation system according to a fourth embodiment of the present application. The electric power quality compensation system includes the current monitor 3 as shown in FIG. 13 and a plurality of compensation units 41. FIG. 17 only illustrates some of the compensation units 41, and the compensation units not illustrated may be connected in a similar manner as that of the illustrated ones, and thus the detailed illustration of which are omitted.

Figure 18:
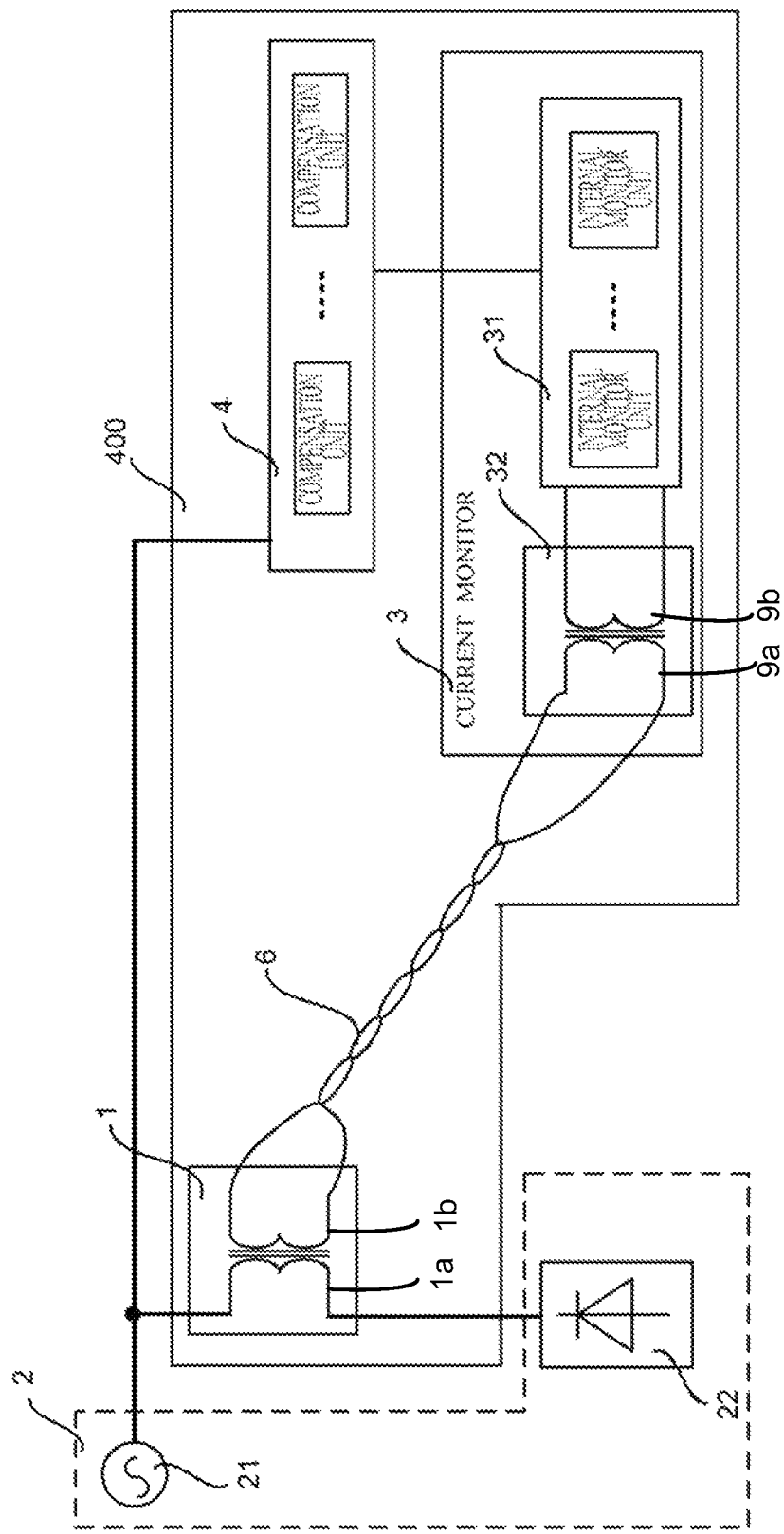
FIG. 18 illustratively shows a structure diagram of an electric power quality compensation system according to a fifth embodiment of the present application.

FIG. 18 illustratively shows a structure diagram of an electric power quality compensation system according to a fifth embodiment of the present application. In the embodiment of electric power quality compensation system 400 as shown in FIG. 18, the external detection module 1 is an external current transformer, and the isolation and transfer module 32 is a interconnecting current transformer. The input side of the isolation and transfer module 32 is the primary side of the interconnecting current transformer, and the output side of the isolation and transfer module 32 is the secondary side of the interconnecting current transformer. The compensation module 4 may also include a plurality of compensation units. The internal monitor module 31 may includes a number of internal monitor units identical to the number of the compensation units. The plurality of compensation units connected in parallel with the external power network 2, may be connected with the plurality of internal monitor units respectively in a one-to-one correspondence. For the connection between the compensation units and the internal monitor units and the detailed connection between the internal monitor units and the isolation and transfer module 32, please see the aforementioned embodiments. Thus, the detailed descriptions thereof are omitted here.

In this embodiment, the compensation module 4 and the non-linear load 22 are connected in parallel with the power grid 21 for example. Alternatively, the above-described compensation module 4 and the non-linear load 22 may be connected in series with the power grid 21. Further descriptions are omitted here.

Based on the function of the isolation and transfer module 32, the turns ratio of the interconnecting current transformer may be adjusted such that the equivalent impedance reflected from the secondary-side loop impedance to the primary-side loop of the transfer current transformer may be reduced. For example, the turns ratio may be 5:4. Because the main function of the external detection module 1 is to convert a large current detected from the power network into a small current suitable for detection, and the isolation and transfer module 32 mainly plays a role of isolation and impedance reduction of the internal monitor module 31 reflected to the external detection module 1, the turns ratio between the primary side 9a and the secondary side 9b of the interconnecting current transformer which serves as the isolation and transfer module 32 is less than the turns ratio between the primary side 1a and the secondary side 1b of the external current transformer which serves as the external detection module 1 (see FIG. 18).

It should be noted that, in the foregoing embodiments, the equivalent impedance reflected to the secondary side of the external current transformer may be reduced by adjusting the turns ratios of the interconnecting current transformers in the current monitor. However, in applications, the smaller equivalent impedance reflected to the secondary side of the external current transformer is not always the better. A reduced turns ratio of the interconnecting current transformer will result in a reduced equivalent impedance reflected to the secondary side of the external current transformer, and meanwhile a reduced second level detection current output from the secondary side of the interconnecting current transformer. The second level detection current is for the detection of the internal monitor units in the internal monitor module, and a too small second level detection current may cause a mismatch between the second level detection current and the measurement scale or the measurement accuracy of the internal monitor units, thus resulting in measurement error or other problems of the whole current monitor. Therefore, in design of the turns ratio of the interconnecting current transformers, the match between the range of the second level detection currents output from the interconnecting current transformers and the measurement scale or accuracy of the internal monitor units may be taken into consideration.

The current monitors and the electric power quality compensation systems provide in the embodiments of the present application may be applied to various situations that the output-side capacity of the external detection module cannot meet requirements.

For example, an APF compensation cabinet includes seven compensation units and seven internal monitor units, and the input ends of all the internal monitor units are connected in series. A typical secondary-side capacity of an external current transformer is 5 VA, which cannot meet the requirements of the compensation cabinet due to a large load in the internal measurement loop thereof or the distance between the external current transformer and the internal monitor module. If the current monitors provided in the embodiments of the present application are to be adopted, the impedance of the internal monitor module reflected to the external current transformer may be reduced by adding an isolation and transfer module having an input side connected with the output side of the external current transformer and an input side connected with two input ends of the internal monitor module which includes a plurality of internal monitor units connected in series, such that the load of the measurement loop in the compensation cabinet or the distance between the external current transformer and the compensation cabinet is no longer limited by the restrictions on the secondary-side capability of the external current transformer. In view of another aspect, it's possible to avoid the situation that the secondary-side load of the external current transformer from going beyond its secondary-side capacity.

Although the present application has been described with reference to the typical embodiments, it should be understood that the terminologies herein are for illustration purposes rather than to limit the present application. The present application may be implemented in many specific embodiments without departing from the spirit and scope of the present application, and thus it shall be appreciated that the above embodiments shall not be limited to any of the specific details described as above, and shall be interpreted broadly within the spirit and scope defined by the appended claims. The appended claims intend to cover all of the modifications and variations falling within the scope of the appended claims and their equivalents.

What is claimed is:

1. A current monitor, comprising:
an internal monitor module configured to output a measurement of current for characterizing a real-time electric power quality of an external power network based on a received detection current, wherein a current of the external power network is detected by an external detection module so that the external detection module outputs a first level detection current; and
an isolation and transfer module comprising an input side and an output side electrically isolated from each other, wherein the input side is configured to be connected with the external detection module, and the output side is configured to be connected with the internal monitor module, wherein the isolation and transfer module receives the first level detection current and outputs a second level detection current to the internal monitor module so as to reduce the impedance of the internal monitor module reflected to the external detection module;

wherein the external detection module is an external current transformer, and the isolation and transfer module is an interconnecting current transformer, and wherein a turns ratio between a primary side and a secondary side of the interconnecting current transformer is less than a turns ratio between a primary side and a secondary side of the external current transformer.

2. The current monitor according to claim 1, wherein the isolation and transfer module comprises X number of isolation and transfer units, and the internal monitor module comprises H number of internal monitor units, wherein X and H are natural numbers greater than or equal to 1;

when X is greater than 1, input sides of the X number of isolation and transfer units are connected in series; the X number of isolation and transfer units receive the first level detection current; and output sides of the isolation and transfer units are connected with an input end of one of the internal monitor units; or the output sides of the isolation and transfer units are connected with input ends of H or less number of internal monitor units, such that the H or less number of internal monitor units receive respectively identical second level detection currents, Wherein an input side of at least one of the X number of isolation and transfer units serves as the input side of the isolation and transfer module, and at least one output side of at least one of the X number of isolation and transfer units serves as the output side of the isolation and transfer module.

3. The current monitor according to claim 2, wherein, when X=H, the output sides of the X number of isolation and transfer units are connected with input ends of the H number of internal monitor units respectively in a one-to-one correspondence.

4. The current monitor according to claim 1, wherein the input side of the isolation and transfer unit is the primary side of the interconnecting current transformer, and the output side of the isolation and transfer unit is the secondary side of the interconnecting current transformer.

5. The current monitor according to claim 1, wherein the turns ratio of the interconnecting current transformer is adjusted so as to reduce an equivalent impedance reflected from a secondary-side loop impedance of the interconnecting current transformer to a primary-side loop impedance of the current transformer.

6. An electric power quality compensation system, comprising:

an external detection module configured to detect a real-time current of an external power network and output a first level detection current;

a current monitor which comprises:

an internal monitor module configured to output a measurement of current for characterizing a real-time electric power quality of the external power network based on a received detection current; and an isolation and transfer module comprising an input side and an output side electrically isolated from each other, wherein the input side is configured to be connected with the external detection module, the output side is configured to be connected with the internal monitor module, and the isolation and transfer module receives the first level detection current and outputs a second level detection current to the internal monitor module so as to reduce the impedance of the internal monitor module reflected to the external detection module; and a compensation module connected with the internal monitor module in the current monitor and configured to compensate the electric power quality of the external power network based on the measurement of current output from the internal monitor module, wherein the external detection module is an external current transformer, and the isolation and transfer module is an interconnecting current transformer, wherein a turns ratio between a primary side and a secondary side of the interconnecting current transformer is less than a turns ratio between a primary side and a secondary side of the external current transformer.

7. The system according to claim 6, wherein the compensation module comprises a plurality of compensation units, the internal monitor module comprises a plurality of internal monitor units, and a number of the internal monitor units is identical to a number of compensation units, wherein the plurality of compensation units are connected with the internal monitor units respectively in a one-to-one correspondence, and the plurality of compensation units are connected in parallel with the external power network.

8. The system according to claim 6, wherein the input side of the isolation and transfer module is the primary side of the interconnecting current transformer, and the output side of the isolation and transfer module is the secondary side of the interconnecting current transformer.

9. The system according to claim 8, wherein a turns ratio of the current transformer is adjusted so as to reduce an equivalent impedance reflected from a secondary-side loop impedance of the interconnecting current transformer to a primary-side loop impedance of the interconnecting current transformer.

10. The system according to claim 6, wherein the external power network comprises a power grid and a non-linear load connected with the power grid.

11. The system according to claim 10, wherein the compensation module and the non-linear load are connected in series or in parallel with the power grid; the compensation module compensates reactive power consumption generated by the non-linear load and/or suppresses harmonics generated by the non-linear load in the external power network, based on the measurement of current output from the current monitor for characterizing the real-time electric power quality of the external power network.

12. The system according to claim 6, wherein the electric power quality compensation system is an active power filter system or a static var generator system.

* * * * *